United States Patent
Park et al.

(10) Patent No.: US 8,896,375 B2
(45) Date of Patent: Nov. 25, 2014

(54) EFFICIENCY IMPROVED ENVELOPE AMPLIFIER USING DUAL SWITCHING AMPLIFIERS

(71) Applicant: Korea Advanced Institute of Science and Technology, Daejeon (KR)

(72) Inventors: ChulSoon Park, Daejeon (KR); HyukSu Son, Daejeon (KR); WooYoung Kim, Daejeon (KR); JooYoung Jang, Daejeon (KR); HaeJin Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 84 days.

(21) Appl. No.: 13/735,395

(22) Filed: Jan. 7, 2013

(65) Prior Publication Data
US 2013/0222062 A1 Aug. 29, 2013

(30) Foreign Application Priority Data
Feb. 24, 2012 (KR) .................. 10-2012-0019211

(51) Int. Cl.
H03G 3/20 (2006.01)
H03F 3/16 (2006.01)
G06F 17/50 (2006.01)
H03F 1/02 (2006.01)

(52) U.S. Cl.
CPC .............. *H03F 3/16* (2013.01); *G06F 17/5072* (2013.01); *H03F 1/0227* (2013.01)
USPC .......................................... 330/136; 330/251

(58) Field of Classification Search
USPC ...................................... 330/136, 251, 207 A
See application file for complete search history.

(56) References Cited

U.S. PATENT DOCUMENTS 6,084,468 A * 7/2000 Sigmon et al. ................ 330/136
8,643,435 B2 * 2/2014 Lim et al. ..................... 330/136
8,698,558 B2 * 4/2014 Mathe et al. .................. 330/251

FOREIGN PATENT DOCUMENTS

KR 10-2006-0103370 A 9/2006
KR 10-2011-0026065 A 3/2011

OTHER PUBLICATIONS

Joon Hyung Kim et al., "High-Efficiency Envelope-Tracking Transmitter With Optimized Class-$F^{-1}$ Amplifier and 2-bit Envelope Amplifier for 3G LTE Base Station", IEEE Transactions on Microwave Theory and Techniques, Jun. 2011, pp. 1610-1621, vol. 59, No. 6.

Jinsung Choi et al., "A Polar Transmitter With CMOS Programmable Hysteretic-Controlled Hybrid Switching Supply Modulator for Multistandard Applications", IEEE Transactions on Microwave Theory and Techniques, Jul. 2009, pp. 1675-1686, vol. 57, No. 7.

(Continued)

Primary Examiner — Henry Choe
(74) Attorney, Agent, or Firm — Rabin & Berdo, P.C.

(57) ABSTRACT

Provided is a hybrid envelope amplifier having improved efficiency, and more particularly, to an envelope amplifier using a dual switching amplifier and having improved efficiency in which power consumption is reduced by controlling a switching current of a switching region according to a magnitude of an envelope input signal, thereby improving efficiency compared to a conventional hybrid envelope amplifier. The envelope amplifier using a dual switching amplifier and having improved efficiency comprises a linear amplifier and a switching amplifier, wherein the switching amplifier includes two or more switching stages that are selectively operated according to a magnitude of an input signal.

12 Claims, 5 Drawing Sheets

(56) References Cited

OTHER PUBLICATIONS

Feipeng Wang et al., "An Improved Power-Added Efficiency 19dBm Hybrid Envelope Elimination and Restoration Power Amplifier for 802.11g WLAN Applications", IEEE Transactions on Microwave Theory and Techniques, Dec. 2006, pp. 4086-4099, vol. 54, No. 12.

Yan Li et al., "Circuits and System Design of RF Polar Transmitters Using Envelope-Tracking and SiGe Power Amplifiers for Mobile WiMAX", IEEE Transactions on Circuits and Systems, May 2011, pp. 893-901, vol. 58, No. 5.

Muhammad Hassan et al., "High Efficiency Envelope Tracking Power Amplifier with Very Low Quiescent Power for 20 MHz LTE", IEEE Radio Frequency Integrated Circuits Symposium (RFIC), Jun. 5-7, 2011, pp. 1-4.

Bumman Kim et al., "Envelope Tracking Technique for Multimode PA Operation", Proceedings of the $39^{th}$ European Microwave Conference, Sep. 29-Oct. 1, 2009, pp. 429-432.

Chin Hsia et al., "Wideband High Efficiency Digitally-Assisted Envelope Amplifier with Dual Switching Stages for Radio Base-Station Envelope Tracking Power Amplifiers", Microwave Symposium Digest (MTT), 2010 IEEE MTT-S International, May 23-28, 2010, pp. 672-675.

\* cited by examiner

EFFICIENCY IMPROVED ENVELOPE AMPLIFIER USING DUAL SWITCHING AMPLIFIERS

BACKGROUND OF THE INVENTION

1. Field of the Invention

The present invention relates to a hybrid envelope amplifier having improved efficiency, and more particularly, to an envelope amplifier using a dual switching amplifier and having improved efficiency in which power consumption is reduced by controlling a switching current of a switching region according to a magnitude of an envelope input signal, thereby improving efficiency compared to a conventional hybrid envelope amplifier.

2. Description of the Related Art

Efficiency of a power amplifier is an important factor that determines a use time of a battery. A portable terminal transmits a large volume of data such as a video as well as a voice data, and in order to transmit such a large volume of data, an orthogonal frequency-division multiplexing (OFDM) scheme which is a digital modulation scheme having high bandwidth efficiency and a peak-to-average-power-ratio (PAPR) is used.

A transmitter using this modulation scheme uses a linear amplifier to increase linearity. The linear amplifier may maintain linearity of a signal by operating in a back-off area to an extent of the PAPR at a maximum output power. The linear amplifier has maximum efficiency at the maximum output power; however, an output is rapidly decreased in the back-off area to degrade overall efficiency of the power amplifier. In order to solve this problem, an envelope tracking technology is used.

When an input signal is small, an envelope tracking power amplifier increases average efficiency by reducing a drain bias voltage. The drain bias voltage is obtained in a structure in which an envelope signal of an RF input signal is extracted and amplified through the envelope amplifier and the drain bias voltage is provided as an input to the power amplifier to adjust a supply voltage according to a magnitude of the RF signal. Efficiency of this structure is determined by the efficiency of the power amplifier multiplied by efficiency of the envelope amplifier, and thus, the envelope amplifier is one of very important components.

FIG. 1 shows an example of a transmitter provided with a conventional envelope tracking amplifier (hereinafter, interchangeably referred to as 'envelope tracking power amplifier' or 'envelope amplifier'), FIG. 2 shows a conventional hybrid envelope tracking amplifier provided in such a transmitter, and FIG. 3 is a photo of a conventional hybrid envelope amplifier implemented in a monolithic microwave integrated circuit (MMIC) chip.

The transmitter provided with the conventional envelope tracking amplifier, as shown in FIG. 1, includes a digital signal generator, a multi-mode hybrid envelope amplifier, and a multi-band power amplifier, and an RF signal modulated and output through the digital signal generator is input to the amplifier envelope and the envelope input signal is used as an input of the envelope amplifier. The envelope tracking amplifier supports multi-modes while amplifying an envelope signal of a desired signal without distortion and maintaining high efficiency. An output of the envelope amplifier is used as the drain bias voltage of the power amplifier. When an input signal of the power amplifier is small, the drain bias voltage is decreased to achieve an effect of increasing overall efficiency.

In addition, the conventional envelope tracking amplifier, as shown in FIG. 2, has a structure in which the linear amplifier (linear stage) and a switching amplifier (switching stage) are combined. The linear amplifier operates as an independent voltage source which amplifies the envelope input signal, and the switching amplifier operates as a dependent current source which provides most of current needed at an output. The hybrid envelope amplifier implements high reliability in a linear region and implements high efficiency in a switching region, thereby satisfying both the reliability and the high efficiency.

However, although most of conventional envelope amplifiers have high efficiency, they are designed to be used in one mode, whereas a next-generation RF transmitter is required to be able to support both multi-bands and the multi-modes. In other words, the envelope amplifier as well as the power amplifier need to support the multi-modes; however, since the conventional envelope tracking amplifiers are designed to operate in one mode as described above, in order to support the multi-modes, amplifiers as many as a number of desired modes need to be connected in parallel and then power is applied to a desired amplifier for use when needed.

Therefore, the conventional envelope tracking amplifier and a transmitter provided therewith have a problem in that a chip and a module become larger, and are inadequate for a polar transmitter system for a single structure.

Accordingly, research results for satisfying various multi-band and multi-mode transmitter systems have been published. Among them, "High Efficiency Envelope Tracking Transmitter for 3G LTE Base Station Optimized with Inverse Class F (Class $F^{-1}$) Amplifier and Two-bit Envelope Amplifier" (Non-Patent Reference 1), "A Polar Transmitter With CMOS Programmable Hysteretic-Controlled Hybrid Switching Supply Modulator for Multi standard Applications" (Non-Patent Reference 2), "Hybrid Envelope Elimination and Restoration Power Amplifier for 802.11g WLAN Applications" (Non-Patent Reference 3), "Circuits and System Design of RF Polar Transmitters Using Envelope-Tracking and SiGe Power Amplifiers for Mobile WiMAX" (Non-Patent Reference 4), "High Efficiency Envelope Tracking Power Amplifier with Very Low Quiescent Power for 20 MHz LTE" (Non-Patent Reference 5), "Apparatus and Method for Envelope Tracking Power Amplifier in Wireless Communication" (Patent Reference 1), and "A New Adaptive Power Amplifier Using Envelope Detection and Cross-talk Cancellation Technique and a Method of Controlling the Same" (Patent Reference 2) are included. In these conventional technologies, the envelope amplifier needs to have efficiency of about 80% or above for each mode in order to satisfy the multi-modes; however, efficiency of the conventional envelope amplifier is decreased according to an increase of a channel band width in each mode, and thus has a problem that the multi-modes are not supported.

PRIOR ART REFERENCE

Patent Reference

1. Korean Patent Application Publication No. 2011-0026065
2. Korean Patent Application Publication No. 2006-0103370

Non-Patent Reference

1. Joon Hyung Kim, Gweon Do Jo, Jung Hoon Oh, Young Hoon Kim, Kwang Chun Lee, Jae Ho Jung, Chul Soon Park, "High Efficiency Envelope Tracking Transmitter with Optimized Class $F^{-1}$ Amplifier and Two-bit Envelope Amplifier for 3G LTE Base station," IEEE Transaction Microwave Theory & Technology, vol. 59, no. 6, pp. 1610-1621, June. 2011.
2. J. Choi, et al., "A Polar Transmitter With CMOS Programmable Hysteretic-Controlled Hybrid Switching Supply Modulator for Multi standard Applications," IEEE Transaction Microwave Theory & Technology, vol. 57, no. 7, pp. 1675-1686, July. 2009
3. F. Wang, D. F. Kimball. J. D. Popp, A. H. Yang, D. Y. Lie, P. M. Asbeck and L. E. Larson, "An Improved Power-Added Efficiency 19-dBm Hybrid Envelope Elimination and Restoration Power Amplifier for 802.11g WLAN Applications," IEEE Transaction Microwave Theory & Technology, vol. 54, no. 12, pp. 4086-4099, December 2006.
4. Yan Li, Jerry Lopez, Donald Y. C. Lie, Kevin Chen, Stanley Wu, Tzu-Yi Yang, Gin-Kou Ma, "Circuits and System Design of RF Polar Transmitters Using Envelope-Tracking and SiGe Power Amplifiers for Mobile WiMAX," IEEE Transaction on Circuits and Systems-I, vol. 58, no. 5, pp. 893-901, May. 2011.
5. Muhammad Hassan, Myoungbo Kwak, Vincent W. Leung, Chin Hsia, Jonmei J. Yan, Donald F. Kimbell, Lawrence E. Larson and Peter M. Asbeck, "High Efficiency Envelope Tracking Power Amplifier with Very Low Quiescent Power for 20 MHz LTE," IEEE Radio Frequency Integrated Circuits Symposium, pp. 1-4, May. 2011.

SUMMARY OF THE INVENTION

Accordingly, the present invention has been made in view of the above problems, and an objective of the present invention is to provide an envelope amplifier using a dual switching amplifier and having improved efficiency, wherein the envelope amplifier may be used in multi-modes with optimum efficiency in each signal mode by using a dual switching amplifier and a switching controller of a hybrid envelope amplifier.

An envelope amplifier using a dual switching amplifier and having improved efficiency according to the present invention to solve the above problem includes a linear amplifier and a switching amplifier, and the switching amplifier includes at least two switching stages which are selectively operated according to a magnitude of an envelope input signal to improve efficiency.

In a preferable embodiment, each switching stage configuring the switching amplifier is configured in a complementary metal-oxide-semiconductor (CMOS) inverter form, and an input of a p-channel metal-oxide-semiconductor (PMOS) of the one of the switching stages is controlled by a switching controller which compares the envelope input signal and a reference signal for adjustment.

In a preferable embodiment, an n-channel metal-oxide-semiconductor (NMOS) configuring the switching stages is always operated, and an anti-shoot through circuit for preventing a switching loss generated in a period in which the PMOS and the NMOS of the switching stages are simultaneously turned on is further included.

In a preferable embodiment, among the switching stages, two transistors configuring a switching stage which is operated at a signal equal to or below a desired signal of an envelope signal is relatively larger than two transistors configuring a switching stage which is operated at a signal equal to or above the desired signal of the envelope signal.

In a preferable embodiment, the switching stages commonly use an NMOS.

In another aspect of the present invention, provided is a method of designing a hybrid envelope amplifier including a linear amplifier and a switching amplifier, the method including:
determining a total size of a transistor of a switching stage considering a switching loss in the switching amplifier;
dividing the determined total size of the transistor of the switching stage into a transistor size for operating two switching stages;
implementing each switching stage in a CMOS inverter type amplifier; and
implementing a circuit such that an input to a PMOS of one of the two switching stages is received from a switching controller and an input to the other switching stage is received from an output of the linear amplifier,
wherein a current of the switching amplifier is output as a sum of a current of the each switching stage.

In a preferable embodiment, an NMOS of the each switching stage is always operated and the PMOS which receives an input from the switching controller is operated when an envelope input signal is equal to or above a predetermined level.

In a preferable embodiment, a transistor size of the switching stage which receives an input from the linear amplifier is larger than a transistor size of the switching stage which receives an input from the switching controller.

In a preferable embodiment, the hybrid envelope amplifier is designed for multi-bands or multi-modes such as EDGE, WCDMA, and LTE, and is implemented in a CMOS monolithic microwave integrated circuit (MMIC).

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, exemplary embodiments of the present invention which a person skilled in the art can readily carry out will be described herein below with reference to the accompanying drawings. In each drawing of the present invention, a size or a measurement of structures is enlarged or reduced than an actual size or measurement to clarify the invention, and known elements are omitted to emphasize a structural feature of the present invention. Thus, the present invention is not limited to the accompanying drawings. In describing principles of preferable embodiments of the present invention, a detailed description of associated known functions or elements will be omitted when it may make the subject matter of the present invention rather unclear.

Figure 4:
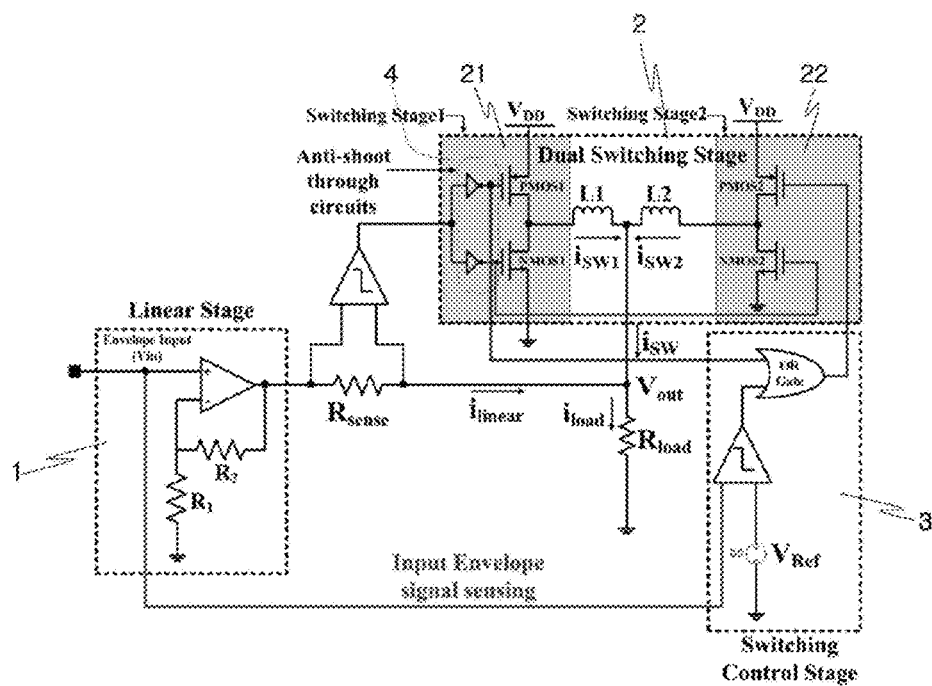
FIG. 4 is a circuit diagram illustrating an example of a hybrid envelope amplifier which can be used in multi-modes according to the present invention.
Figure 5:
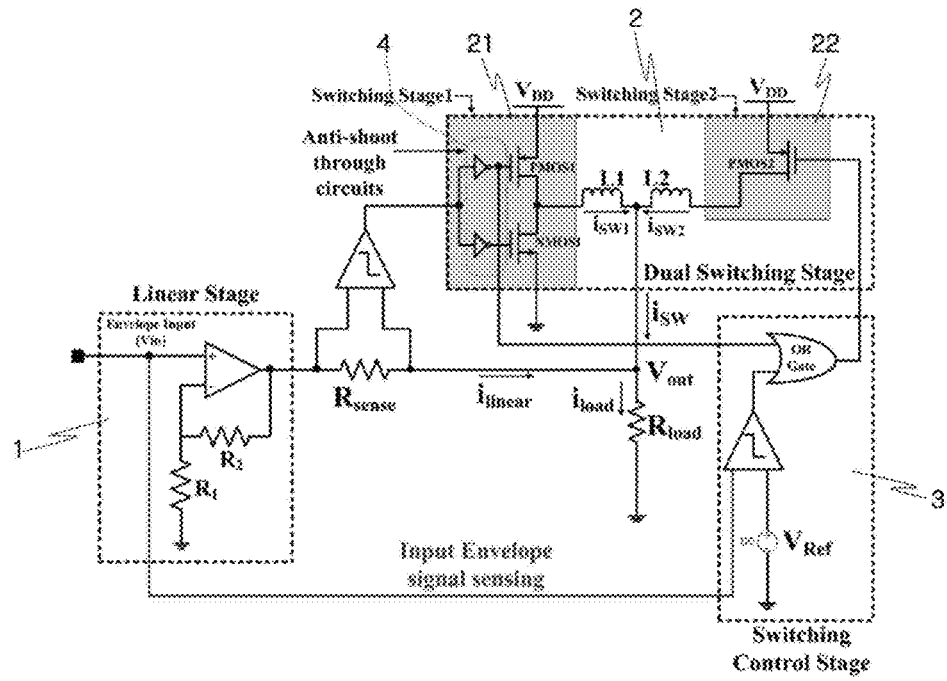
FIG. 5 is a circuit diagram illustrating another example of a hybrid envelope amplifier which can be used in multi-modes according to the present invention.

The present invention is to provide an envelope amplifier which can be used in multi-modes with optimum efficiency in each signal mode, and as shown in FIG. 4 and FIG. 5, the present invention is characterized in that a switching amplifier 2 includes two or more switching stages 21, 22 which selectively operate according to a magnitude of an input signal.

The envelope amplifier of the present invention is provided with a linear amplifier 1 which is the same or similar to a general envelope amplifier, and includes a current sensing resistor, a comparator, a gate adjustment driver, etc.

The switching stages 21, 22 comprise a PMOS and an NMOS as shown in FIG. 4, and the NMOS may be used commonly for the two stages as shown in FIG. 5.

The envelope amplifier of the present invention has a structure in which linearity which is an advantage of the linear amplifier 1 and high efficiency which is an advantage of the switching amplifier 2 are combined, and the linear amplifier 1 operates as an independent voltage source which amplifies an envelope input signal, and the switching amplifier 2 operates as a dependent current source which provides most of current needed at an output. An output voltage is adjusted by an input voltage, and an output current may be expressed as a sum of a current of the linear amplifier 1 and a current of the switching amplifier 2, and the following power loss components need to be considered in order to design the switching amplifier 2.

$$P_{cond} = R_{on} \cdot I_{O\_RMS}^2$$
$$P_{gd} = (C_{gN} + C_{gp}) \cdot V_{DD}^2 \cdot f_{sw}$$
$$P_{sw} = C_D \cdot V_{DD}^2 \cdot f_{sw} + I_D \cdot V_{DS} \cdot t_f \cdot f_{sw}$$
$$P_{Total} = P_{cond} + P_{gd} + P_{sw}$$
$$= R_{on} \cdot I_{O\_RMS}^2 + (C_{gN} + C_{gp}) \cdot V_{DD}^2 \cdot f_{sw} +$$
$$C_D \cdot V_{DD}^2 \cdot f_{sw} + I_D \cdot V_{DS} \cdot t_f \cdot f_{sw}$$

A switch loss component comprises a conduction loss $P_{cond}$, a gate driver loss $P_{gd}$ and a switching loss $P_{sw}$. The conduction loss $P_{cond}$ is a loss caused by a resistance $R_{on}$ generated when a transistor is turned on, and as a size of the transistor increases, the resistance $R_{on}$ decreases, thereby reducing the conduction loss.

The gate driver loss $P_{gd}$ is a loss caused by a parasitic capacitance $(C_{gN}+C_{gP})$ viewed from a gate terminal, and a value of the parasitic capacitance increases in proportion to the size of the transistor, thereby increasing the loss.

The switching loss $P_{sw}$ is a loss generated during a period in which the PMOS and the NMOS are turned on at the same time in the switching amplifier of an inverter type, and as shown in FIG. 4 and FIG. 5, an anti-shoot through circuit 4 for preventing the switching loss is provided at an input terminal of the switching amplifier. The anti-shoot through circuit 4 eliminates the period in which the PMOS and the NMOS are turned on at the same time, thereby preventing the switching loss.

Thus, by removing the switching loss, only the conduction loss and the gate driver loss are considered among the power loss component of the switching amplifier, and the two components have a trade-off relationship depending on the size of the transistor. Therefore, the size of the transistor needs to be designed to be adjusted in order to minimize a sum of the conduction loss and the gate driver loss.

In the envelope amplifier according to the present invention, the switching amplifier 2 has a dual structure of two switching stages 21, 22, and an operating range of the second switching stage 22 is determined by Vref in a switching control stage. In other words, depending on a level of the envelope signal output from the linear amplifier 1, only a part or all of transistors of the switching amplifier 2.

To control an operation of the two switching stages 21, 22 which operate as above, a switching controller 3 is provided. The switching controller 3, as shown, may comprise a comparator and an OR-gate.

Figure 1:
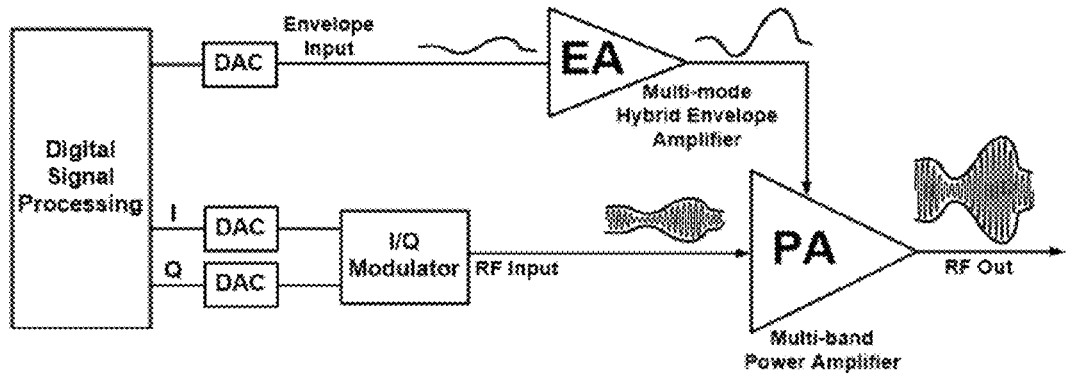
FIG. 1 is a circuit diagram of a transmitter provided with a conventional envelope amplifier.
Figure 2:
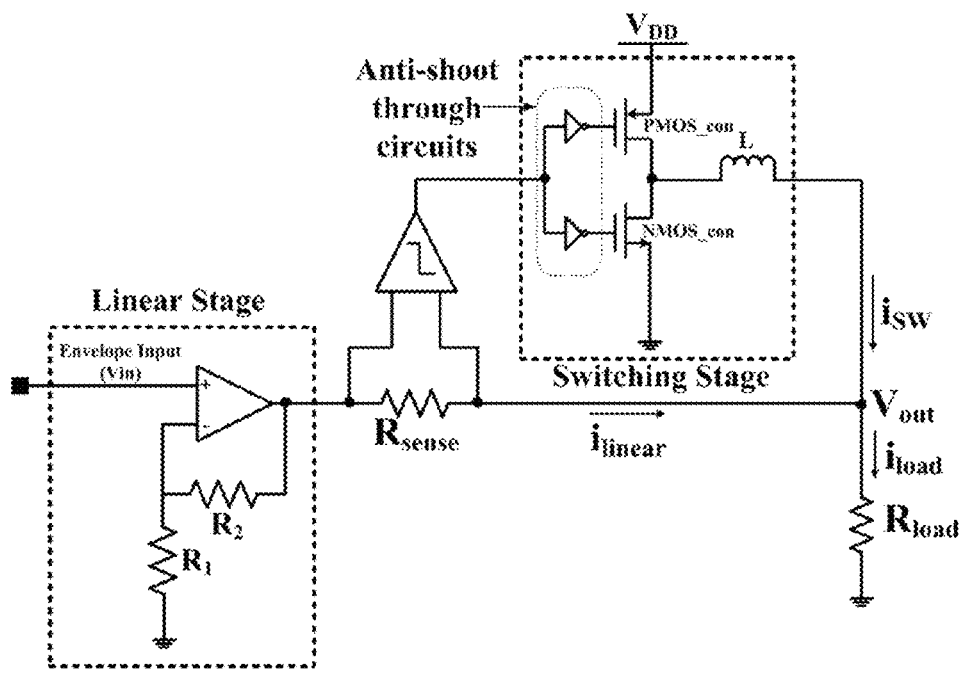
FIG. 2 is a circuit diagram of a conventional hybrid envelope amplifier.

The switching amplifier 2 according to the present invention configured as above may be produced in the same size as a conventional switching amplifier, and if it is assumed that a size ratio of a PMOS_con and an NMOS_con which configure the conventional switching amplifier shown in FIG. 2 is a:b, a size ratio of a PMOS1 and an NMOS1 of the switching stage 21 of the switching amplifier 2 of the present invention and a size ratio of a PMOS2 and an NMOS2 of the switching stage 22 are a1:b1 and a2:b2, respectively, and a1 and a2, b1 and b2 have the following relationships.

$$a=a1+a2, a1>a2$$

$$b=b1+b2, b1>b2$$

In other words, in the switching stages 21, 22, it is preferable to design such that the size of two transistors PMOS1, NMOS1 which configure the first switching stage 21 operating at or below a desired signal of the envelope signal is relatively larger than that of the two transistors PMOS2, NMOS2 which configure the second switching stage 22 operating at or above the desired signal of the envelope signal.

As described above, when the input envelope signal is equal to or below a predetermined level, the PMOS1 and the NMOS1 of the first switching stage 21 and the NMOS2 of the second switching stage 22 operate. In other words, the NMOS's (NMOS1, NMOS2) of each switching stage 21, 22 always operate. Thus, since an amount of current that needs to be supplied to a load is relatively small at or below a certain input level, there exists no burden of current supply even in a case where the PMOS1 has a smaller size compared to a size of the PMOS_con of the conventional switching amplifier shown in FIG. 2 and power consumption may be reduced.

When the input envelope signal is equal to or above the predetermined level, all of the two switching stages 21, 22 which configure the switching amplifier 2 operate. Here, the same operation with the size of the conventional PMOS_con is performed, and when required current is supplied, the PMOS1 and the PMOS2 operate at the same time.

The switching controller 3 controls the PMOS of the second switching stage by comparing an input envelope signal Vin and a reference voltage Vref. Particularly, the switching controller 3 controls an operating range of the switching stage 22 and may determine the operating range by using the reference voltage Vref, and optimized efficiency for each mode may be obtained based thereon. The operating range of the switching stage 22 is determined by adjusting the reference voltage Vref.

FIG. 5 shows another example of a hybrid envelope amplifier according to the present invention, which has a structure where an NMOS is commonly used in a switching area of an inverter form.

Table 1 shows simulation results of applying a sine wave to amplifiers having a conventional basic structure and a proposed structure of the present invention. It can be seen that the envelope amplifier of the present invention has efficiency improved about 6% than the conventional basic structure, which is due to reduced power consumption of the switching area. In other words, the loss component of the switching area is reduced.

TABLE 1

|  | The envelope amplifier of a basic type | The proposed envelope amplifier |
|---|---|---|
| Distinction of Switching areas | Single | Dual |
| Pdc_linear | 223.8 mW | 280.6 mW |
| Pdc_swithch1 | 2797 mW | 2459 mW |
| Pdc_switch2 | — | 41 mW |
| Pout | 2362 mW | 2362 mW |
| Avg. Efficiency | 78.18% | 84.73% |

Figure 3:
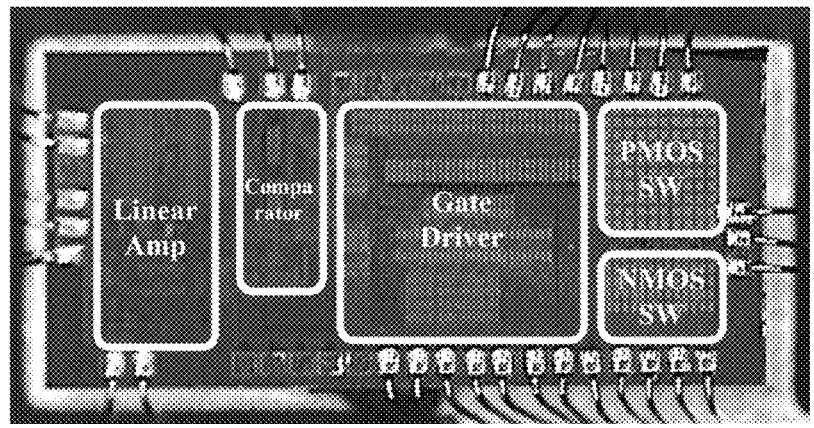
FIG. 3 is a photo of a conventional hybrid envelope amplifier implemented in a monolithic microwave integrated circuit (MMIC) chip.
Figure 6:
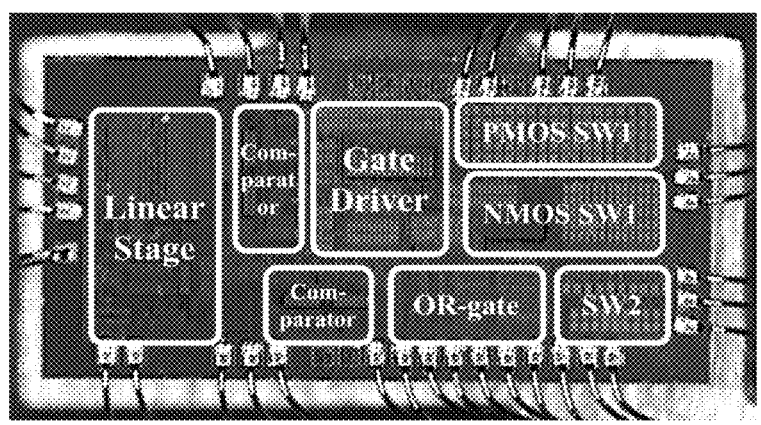
FIG. 6 is a photo of a hybrid envelope amplifier according to the present invention implemented in an MMIC chip.
Figure 7:
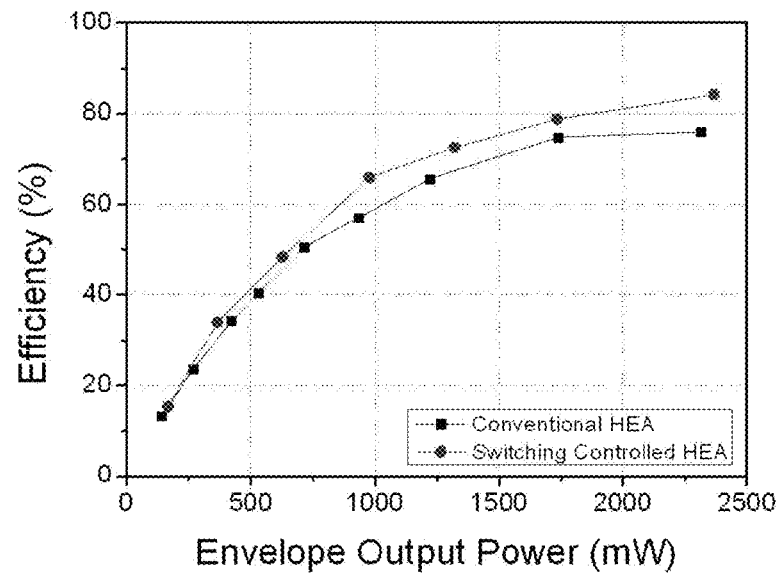
FIGS. 7-9 are graphs illustrating measurement values obtained by applying EDGE, WCDMA, LTE signals to a hybrid envelope amplifier according to the present invention.
Figure 8:
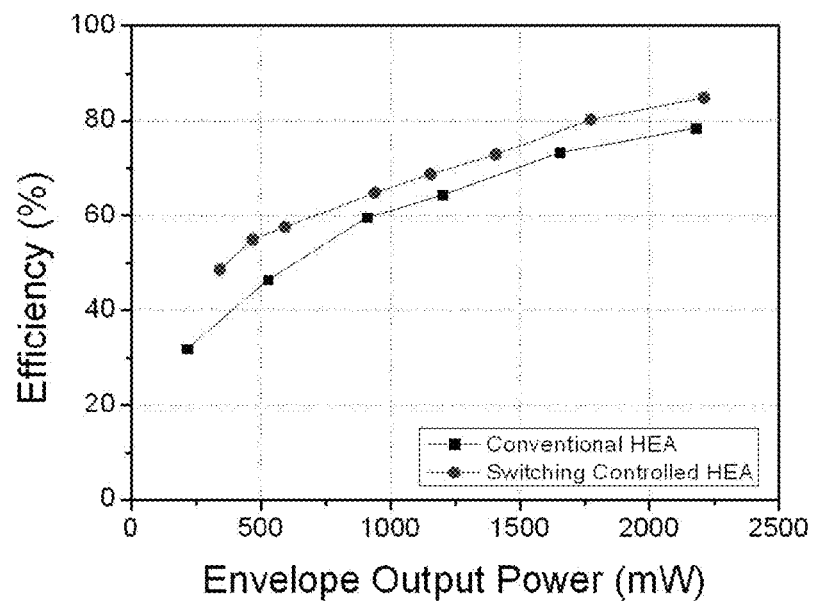
Figure 9:
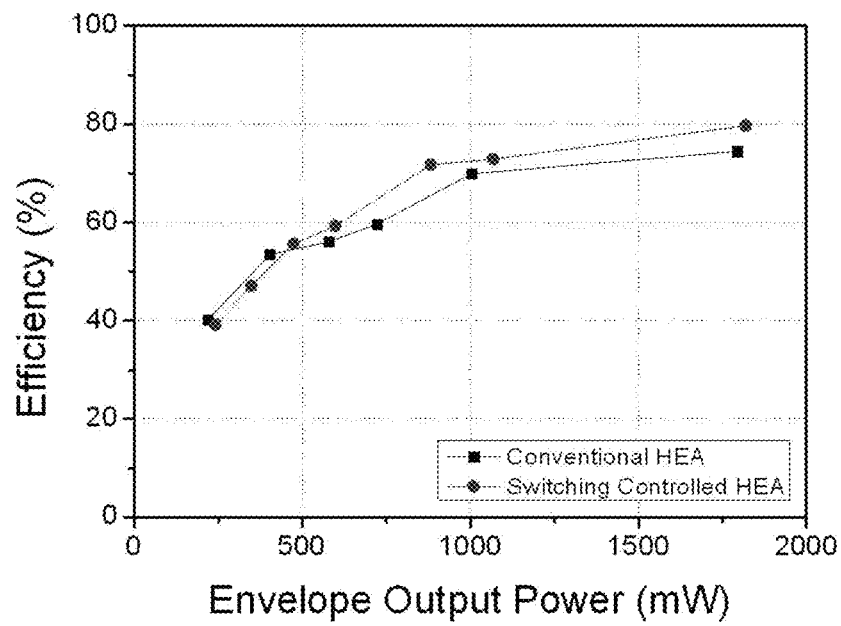

FIG. 6 is a photo of a dual envelope amplifier according to the present invention implemented in a monolithic microwave integrated circuit (MMIC) chip, and a chip size of the conventional amplifier illustrated in FIG. 3 is 2.2 mm×1.05 mm, and a chip size of the amplifier of the present invention is 2.3 mm×1.1 mm, which is barely different from that of the conventional amplifier while satisfying the multi-modes.

FIG. 7 through FIG. 10 are measurement examples of an envelope amplifier having a dual switching amplifier, wherein EDGE, WCDMA, LTE signals which are actually used in a wireless communication are applied, the signals having respectively a bandwidth of 0.284/3.84/5 MHz and having respectively a PARR of 3.5/4/7 dB.

Figure 10:
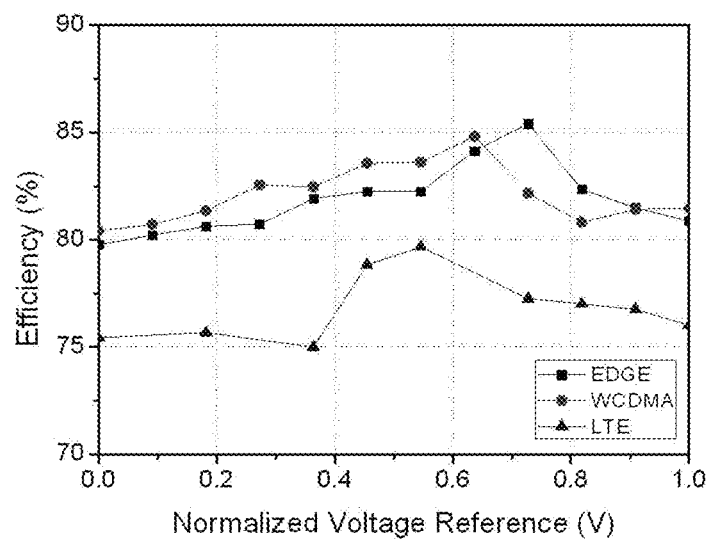
FIG. 10 is a graph illustrating a change of efficiency of a switching controlled hybrid envelope amplifier relative to $V_{ref}$.

Maximum efficiency of the applied signals is 85% efficiency for the EDGE, 84% efficiency for the WCDMA, and 79% efficiency for the LTE, thereby satisfying the multi-modes (See FIG. 7 through FIG. 9), and a normalized reference voltage Vref at which the maximum efficiency for each mode is obtained is 0.73V in the EDGE, 0.64V in the WCDMA, and 0.53 V in the LTE (See FIG. 10). The envelope amplifier of the present invention may obtain the optimum efficiency for each mode, and obtains a result of maximum 9% improvement of efficiency than the conventional envelope amplifier.

What is claimed is:

1. A hybrid envelope amplifier comprising:
    a linear amplifier;
    a switching controller comparing an envelope input signal and a reference signal for adjustment; and
    a switching amplifier including,
        a first switching stage receiving an output of the linear amplifier, and
        a second switching stage receiving an output of the switching controller,
    wherein the first switching stage and the second switching stage are selectively operated according to a magnitude of the envelope input signal and the first switching stage is formed in a complementary metal-oxide-semiconductor (CMOS) inverter.

2. The hybrid envelope amplifier of claim 1, wherein the switching controller controls an input of a p-channel metal-oxide-semiconductor (PMOS) of the second switching stage.

3. The hybrid envelope amplifier of claim 1, wherein the first switching stage and the second switching stage respectively include an n-channel metal-oxide-semiconductor (NMOS) and the NMOS is always operated.

4. The hybrid envelope amplifier of claim 3, wherein the first switching stage further comprises an anti-shoot through circuit for preventing a switching loss generated in a period in which the PMOS and the NMOS of the switching stages are simultaneously turned on.

5. The hybrid envelope amplifier of claim 1, wherein a size of two transistors configuring one of the first switching stage and the second switching stage which is operated at a signal equal to or below a desired signal of the envelope signal is relatively larger than that of two transistors configuring the other one of the first switching stage and the second switching stage which is operated at a signal equal to or above the desired signal of the envelope signal.

6. The hybrid envelope amplifier of claim 1, wherein the first switching stage and the second switching stage commonly use an NMOS.

7. A method of designing a hybrid envelope amplifier comprising a linear amplifier and a switching amplifier, the method comprising:
    determining a total size of a transistor of a switching stage considering a switching loss in the switching amplifier;
    dividing the determined total size of the transistor of the switching stage into a transistor size for operating two switching stages;
    implementing each switching stage in a CMOS inverter type amplifier; and
    implementing a circuit such that an input to a PMOS of one of the two switching stages is received from a switching controller and an input to the other switching stage is received from an output of the linear amplifier, wherein a current of the switching amplifier is output as a sum of a current of the each switching stage.

8. The method of claim 7, wherein an NMOS of the each switching stage is always operated and the PMOS which receives an input from the switching controller is operated when an envelope input signal is equal to or above a predetermined level.

9. The method of claim 7, wherein a transistor size of the switching stage which receives an input from the linear amplifier is larger than a transistor size of the switching stage which receives an input from the switching controller.

10. The method of claim 7, wherein the hybrid envelope amplifier is designed for multi-bands or multi-modes.

11. The method of claim 10, wherein the multi-bands or the multi-modes include EDGE, WCDMA, and LTE.

12. The method of claim 7, wherein the hybrid envelope amplifier is implemented in a CMOS monolithic microwave integrated circuit (MMIC).

* * * * *